(12) United States Patent
Mikawa et al.

(10) Patent No.: US 9,570,682 B2
(45) Date of Patent: Feb. 14, 2017

(54) SEMICONDUCTOR MEMORY DEVICE AND METHOD OF MANUFACTURING THE SAME

(71) Applicant: Panasonic Intellectual Property Management Co., Ltd., Osaka (JP)

(72) Inventors: Takumi Mikawa, Shiga (JP); Takashi Okada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 8 days.

(21) Appl. No.: 14/879,625

(22) Filed: Oct. 9, 2015

(65) Prior Publication Data

US 2016/0035976 A1 Feb. 4, 2016

Related U.S. Application Data

(62) Division of application No. 13/392,555, filed as application No. PCT/JP2010/005261 on Aug. 26, 2010, now abandoned.

(30) Foreign Application Priority Data

Aug. 28, 2009 (JP) ................................. 2009-197818

(51) Int. Cl.
  *H01L 45/00* (2006.01)
  *H01L 27/10* (2006.01)
(52) U.S. Cl.
  CPC ......... *H01L 45/1608* (2013.01); *H01L 27/101* (2013.01); *H01L 45/1233* (2013.01);
  (Continued)

(58) Field of Classification Search
  None
  See application file for complete search history.

(56) References Cited

U.S. PATENT DOCUMENTS 6,001,660 A 12/1999 Park et al.
7,781,230 B2 8/2010 Odagawa et al.
(Continued)

FOREIGN PATENT DOCUMENTS

JP 10-303397 11/1998
JP 11-111947 4/1999
(Continued)

OTHER PUBLICATIONS

International Search Report issued Nov. 30, 2010 in International (PCT) Application No. PCT/JP2010/005261.
Partial English translation of WO 2008/117371, Oct. 2008.

*Primary Examiner* — Abul Kalam
(74) *Attorney, Agent, or Firm* — Wenderoth, Lind & Ponack, L.L.P.

(57) ABSTRACT

Provided are a variable resistance semiconductor memory device which changes its resistance without being affected by an underlying layer and is suitable as a memory device of increased capacity, and a method of manufacturing the same. The semiconductor memory device in the present invention includes: a first contact plug formed inside a first contact hole penetrating through a first interlayer insulating layer; a lower electrode having a flat top surface and is thicker above the first interlayer insulating layer than above the first contact plug; a variable resistance layer; and an upper electrode. The lower electrode, the variable resistance layer, and the upper electrode compose a variable resistance element.

9 Claims, 12 Drawing Sheets

(52) U.S. Cl.
CPC ........ *H01L 45/1253* (2013.01); *H01L 45/145* (2013.01); *H01L 45/146* (2013.01); *H01L 45/1675* (2013.01)

(56) References Cited

U.S. PATENT DOCUMENTS

| | | |
|---|---|---|
| 8,022,502 B2 | 9/2011 | Kanzawa et al. |
| 2004/0202041 A1 | 10/2004 | Hidenori |
| 2007/0240995 A1 | 10/2007 | Odagawa et al. |
| 2009/0283736 A1 | 11/2009 | Kanzawa et al. |
| 2009/0321711 A1 | 12/2009 | Takagi et al. |
| 2010/0038617 A1 | 2/2010 | Nakajima et al. |
| 2010/0176363 A1 | 7/2010 | Takahashi et al. |
| 2011/0001110 A1 | 1/2011 | Takahashi et al. |
| 2011/0294259 A1 | 12/2011 | Kanzawa et al. |
| 2012/0161095 A1 | 6/2012 | Mikawa et al. |

FOREIGN PATENT DOCUMENTS

| | | |
|---|---|---|
| JP | 2006-303544 | 11/2006 |
| JP | 2006-318982 | 11/2006 |
| JP | 2007-250635 | 9/2007 |
| JP | 2007-287761 | 11/2007 |
| JP | 2008-192995 | 8/2008 |
| JP | 2008-198941 | 8/2008 |
| JP | 2009-004725 | 1/2009 |
| WO | 2008/117371 | 10/2008 |
| WO | 2008/149484 | 12/2008 |
| WO | 2008/149605 | 12/2008 |
| WO | 2009/125777 | 10/2009 |

(a)

Recess depth: 27 nm (b)

Recess depth: 1 nm or smaller (a)

(b)

SEMICONDUCTOR MEMORY DEVICE AND METHOD OF MANUFACTURING THE SAME

TECHNICAL FIELD

The present invention relates to a variable resistance semiconductor memory device having a resistance value that changes according to application of a voltage pulse.

BACKGROUND ART

Recent years have seen further enhancement in functionality of electronic devices such as mobile information devices and information appliances following the development of digital technology. With the enhanced functionality in these electronic devices, miniaturization and increase in speed of semiconductor elements for use therein are rapidly advancing. Among these, application of large-capacity nonvolatile memories represented by a flash memory is rapidly expanding. In addition, as a next-generation new-type nonvolatile memory to replace the flash memory, research and development on a variable resistance semiconductor memory device which uses what is called a variable resistance element is advancing. Here, variable resistance element refers to an element having a property in which resistance reversibly changes according to electrical signals, and capable of storing information corresponding to the value of the resistance value in a nonvolatile manner.

As an example of such a variable resistance element, there is proposed a nonvolatile memory device having a variable resistance layer in which transition metal oxides having different oxygen content percentages are stacked. For example, PTL 1 discloses selectively causing oxidation reaction and reduction reaction in an interface where an electrode and a variable resistance layer having a high oxygen content percentage are in contact, to stabilize resistance change.

The conventional variable resistance element includes a lower electrode, a variable resistance layer, and an upper electrode. The variable resistance layer is of a stacked structure including a first variable resistance layer and a second variable resistance layer, and the first and second variable resistance layers include the same type of transition metal oxide. The oxygen content percentage of the transition metal oxide in the second variable resistance layer is higher than the oxygen content percentage of the transition metal oxide in the first variable resistance layer. With such a structure, when voltage is applied to the variable resistance element, most of the voltage is applied to the second variable resistance layer which having a higher oxygen content percentage and exhibits a higher resistance value. Furthermore, oxygen, which can contribute to the reaction, is abundant in the vicinity of the interface. Therefore, oxidation reaction and reduction reaction occur selectively at the interface between the upper electrode and the second variable resistance layer, and resistance thereby changes stably.

CITATION LIST

Patent Literature

[PTL 1] International Publication No. 2008/149484

SUMMARY OF INVENTION

Technical Problem

However, there is a problem that resistance change characteristics have varied among the conventional variable resistance nonvolatile memory devices manufactured under conventional conditions.

The present invention is conceived to solve the problem and has as an object of providing a variable-resistance semiconductor memory device having less variable resistance-change characteristics and a method of manufacturing the variable-resistance semiconductor memory device with reduced variation of resistance change characteristics.

Solution to Problem

A semiconductor memory device provided according to an aspect of the present invention in order to achieve the object includes: a semiconductor substrate; a first conductive layer formed on the semiconductor substrate; a first interlayer insulating layer formed on the semiconductor substrate so as to cover the first conductive layer; a first contact hole penetrating through the first interlayer insulating layer down to the first conductive layer; a first contact plug formed inside the first contact hole and having a top surface located lower than a top surface of the first interlayer insulating layer; a lower electrode formed on the first interlayer insulating layer so as to cover the first contact plug and having a planarized top surface, the lower electrode being thicker above the first contact plug than above the first interlayer insulating layer; a variable resistance layer formed on the lower electrode; and an upper electrode formed on the variable resistance layer, wherein the lower electrode, the variable resistance layer, and the upper electrode compose a variable resistance element, and the variable resistance layer is composed of a first variable resistance layer comprising a transition metal oxide and a second variable resistance layer comprising a transition metal oxide having an oxygen content percentage higher than an oxygen content percentage of the transition metal oxide in the first variable resistance layer, the variable resistance layer being brought into a state to be ready to start resistance change, by locally short-circuiting part of the second variable resistance layer.

With this configuration, even when a recess is present above the first contact plug, the lower electrode above the recess is thick, and thus the top surface of the lower electrode can be made flat. Variation in the shape and thickness of the variable resistance layer and is caused only by essential variation in the method of forming the variable resistance layer or the method of oxidization, and are therefore not affected by the shape of the layer underlying the variable resistance layer. Thus, it is possible to significantly reduce variation of resistance change characteristics between bits caused by an underlying layer.

In the semiconductor memory device, the lower electrode may be composed of a plurality of layers. With this, a layer of a conductive material that allows easy planarization of a top surface can be provided as the underlying layer, and a layer of a conductive material that allows the layer to serve as an electrode can be provided as an upper layer.

Here, the lower electrode may include: a first lower electrode; and a second lower electrode provided on the first lower electrode, wherein a top surface of the first lower electrode above the first contact plug is lower than above the first interlayer insulating layer, and the second lower electrode has a planarized top surface and is thicker above the first contact plug than above the first interlayer insulating layer. Alternatively, the first lower electrode may have a planarized top surface and be thicker above the first contact plug than above the first interlayer insulating layer, and the second lower electrode may be as thick above the first contact plug as above the first interlayer insulating layer.

With either of the configurations, the lower electrode has a planarized top surface.

Furthermore, in the above-described semiconductor memory devices, the variable resistance layer may be composed of transition metal oxides, and is of a stacked structure including a first variable resistance layer having a lower oxygen content percentage and a second variable resistance layer having a higher oxygen content percentage. This is because the present invention produces an advantageous effect that the initial breakdown characteristics are made extremely stable even for an element that requires an initial breakdown before starting resistance change.

A method of manufacturing a semiconductor memory device according to an aspect of the present invention is a method of manufacturing a semiconductor memory device which includes a variable resistance element composed of: a lower electrode; a variable resistance layer formed on the lower electrode and including a first variable resistance layer comprising a transition metal oxide and a second variable resistance layer comprising a transition metal oxide having an oxygen content percentage higher than an oxygen content percentage of the transition metal oxide in the first variable resistance layer; and an upper electrode formed on the variable resistance layer, and the method includes: forming a first lower conductive layer on a semiconductor substrate; forming a first interlayer insulating layer on the semiconductor substrate so as to cover the first conductive layer; forming a first contact hole penetrating through the first interlayer insulating layer down to the first conductive layer; forming a first contact plug inside the first contact hole so that a recess is formed to be depressed from a top surface of the first interlayer insulating layer toward the substrate; depositing the lower electrode material film on the first interlayer insulating layer so as to cover the first contact plug; forming a lower electrode having a flat, continuous top surface by planarizing the deposited lower electrode material film by polishing a top surface of the lower electrode material film until a depression in the top surface of the lower electrode material film disappears so that only a single material is polished in the polishing and the lower electrode material film is left behind throughout a wafer, the depression created in the top surface into which a shape of the recess is transferred; forming, on the lower electrode material film, variable resistance layer material films and an upper electrode material film in this order, the variable resistance layer material film being to become the variable resistance layer, and the upper electrode material films to become the upper electrode; and forming the variable resistance element by patterning the lower electrode material film, the variable resistance layer material films, and the upper electrode material film.

Furthermore, the lower electrode of the semiconductor memory device manufactured using the method may be composed of a plurality of layers including a first lower electrode and a second lower electrode, and the forming of a lower electrode material film which has a planarized top surface may include: depositing a first lower electrode material film on the first interlayer insulating layer so as to cover the first contact plug, the first lower electrode material film being to become the first lower electrode; planarizing, by polishing, a top surface of the deposited first lower electrode material film; and depositing, on the planarized top surface of the first lower electrode material film, a second lower electrode material film which has a uniform thickness and is to become the second lower electrode.

Furthermore, the lower electrode of the semiconductor memory device manufactured using the method may be composed of a plurality of layers including a first lower electrode and a second lower electrode, and the forming of a lower electrode material film which has a planarized top surface may include: depositing a first lower electrode material film on the first interlayer insulating layer so as to cover the first contact plug, the first lower electrode material film being to become the first lower electrode; depositing a second lower electrode material film on the first lower electrode material film, the second lower electrode material film being to become the second lower electrode; and planarizing, by polishing, a top surface of the second lower electrode material film.

By using the method, even when there is a recess above the first contact plug, the top surface of the lower electrode can be made approximately flat above the recess. Variation in the shape of the variable resistance layer and variation in the film thickness are caused only by essential variation in the method of forming the variable resistance layer or the method of oxidization, and are therefore not affected by the shape of the layer underlying the variable resistance layer. Thus, it is possible to significantly reduce variation of resistance change characteristics between bits caused by an underlying layer.

Furthermore, in the method of manufacturing a semiconductor memory device, the planarizing of the top surface of one of the lower electrode and the first lower electrode material film is performed by chemical mechanical polishing. This is because polishing the surface by chemical mechanical polishing dramatically increases flatness of the lower electrode.

Furthermore, the method of manufacturing a semiconductor memory device may include bringing the variable resistance layer into a state to be ready to start resistance change, by locally short-circuiting part of the second variable resistance layer.

Such a manufacturing method is preferably used especially for manufacturing a variable resistance element including initial breakdown brings the variable resistance layer into a state to be ready to start resistance change.

Furthermore, the method of manufacturing a semiconductor memory device may be used for manufacturing a semiconductor memory device in which the second variable resistance layer has a thickness which is less than a crosswise width of the recess.

This is because variation in breakdown rates which is caused when the second variable resistance layer has a thickness less than the crosswise width of the recess can be reduced when the semiconductor memory device is manufactured using such a method.

Advantageous Effects of Invention

The semiconductor memory device according to the present invention has reduced variation in the shape and thickness of the variable resistance layer even when recesses are present above the contact plugs below the variable resistance elements and the depths of the recesses are varied. This is achieved by a structure in which the lower electrodes have top surfaces planarized in principle using the method according to the present invention, and thereby variation of resistance change characteristics of the semiconductor memory device is advantageously reduced. This can be achieved because the variation in the shape and thickness of the variable resistance layer due to the influence of the shape of an underlying layer can be reduced in principle by forming the variable resistance layer above the planarized lower electrodes. In particular, this can dramatically decreases the probability of bit errors in large-capacity memory of gigabits, so that large-capacity nonvolatile memory can be provided.

Figure 2:
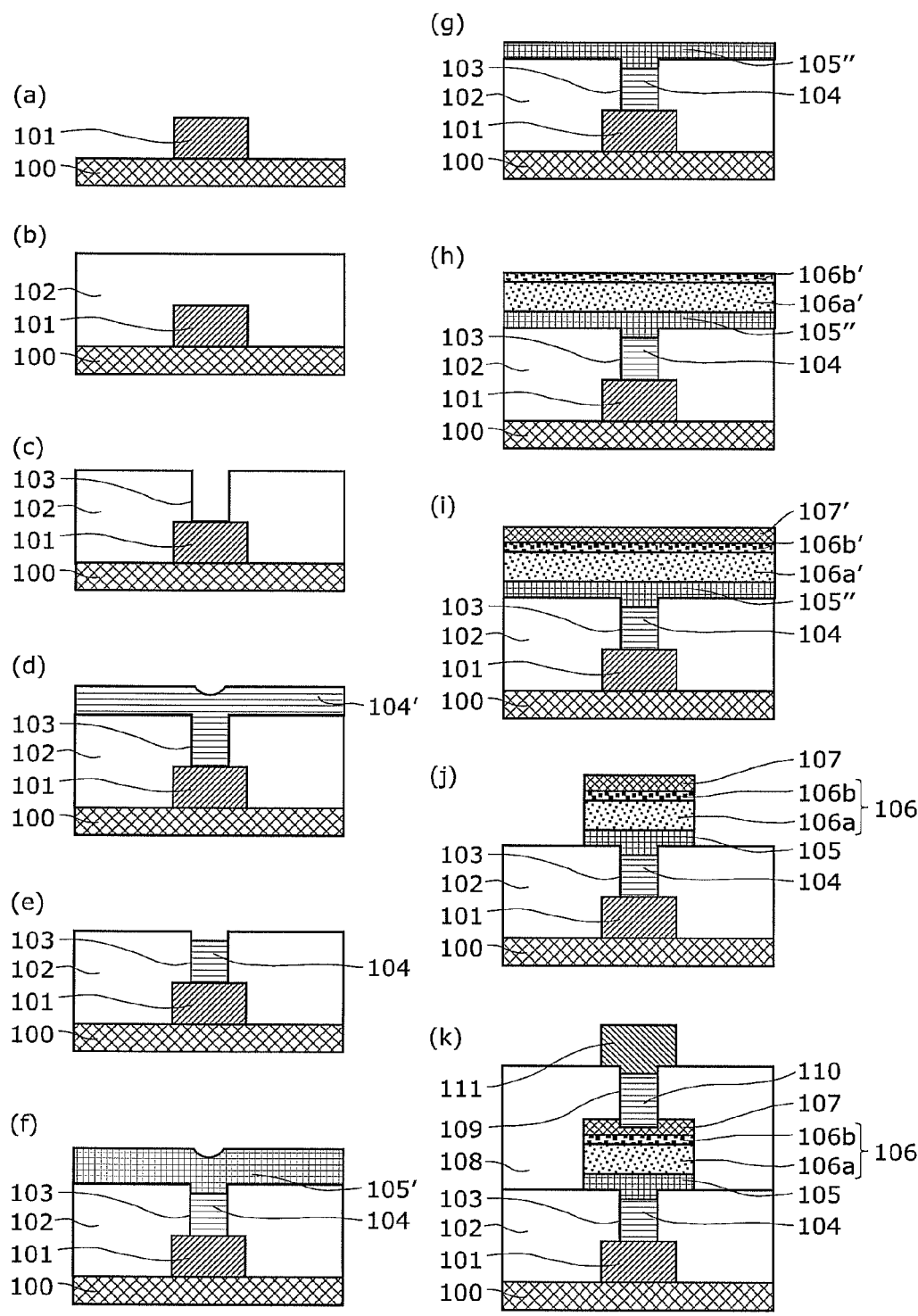

(a) to (k) in FIG. 2 illustrate cross-sectional views for showing a method of manufacturing a main part of the semiconductor memory device according to Embodiment 1 of the present invention.

Figure 3:
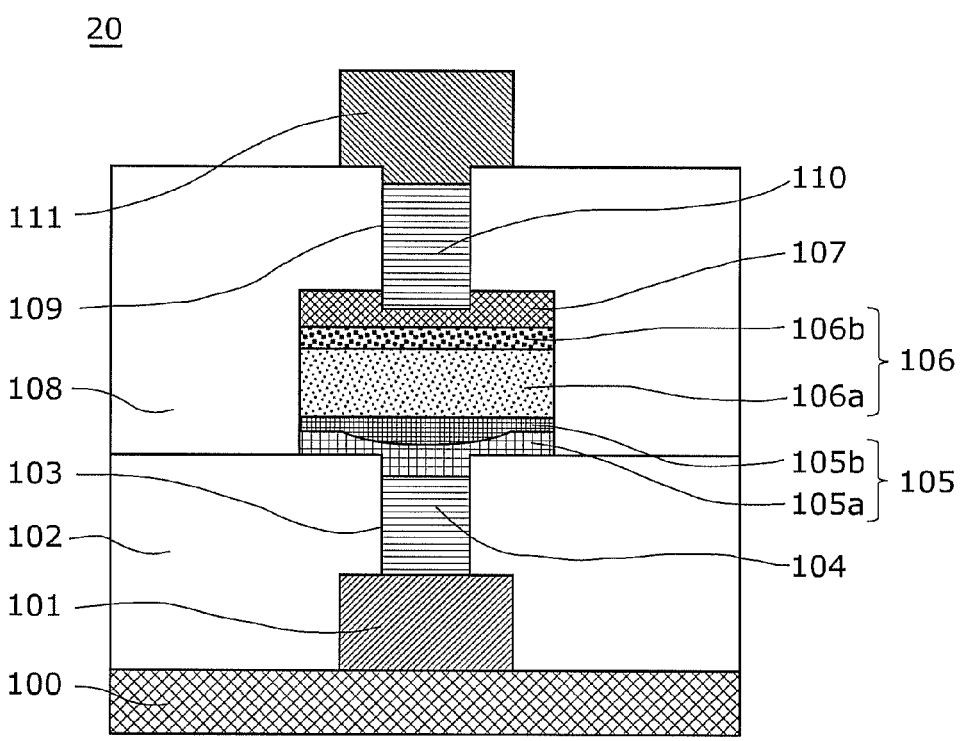

FIG. 3 illustrates a cross-sectional view of an exemplary configuration of a semiconductor memory device according to Embodiment 2 of the present invention.

Figure 4:
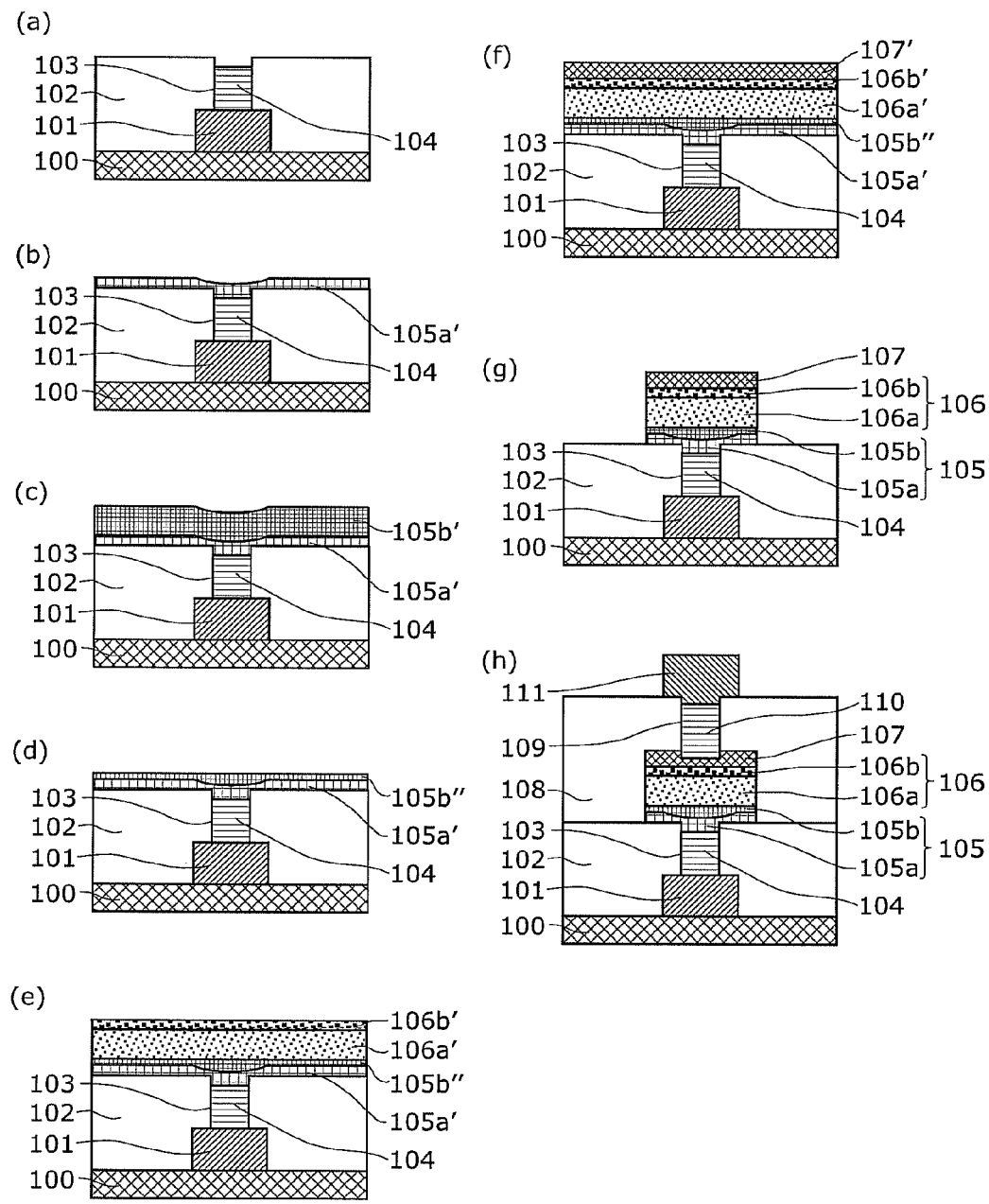

(a) to (h) in FIG. 4 illustrate cross-sectional views for showing a method of manufacturing a main part of the semiconductor memory device according to Embodiment 2 of the present invention.

Figure 5:
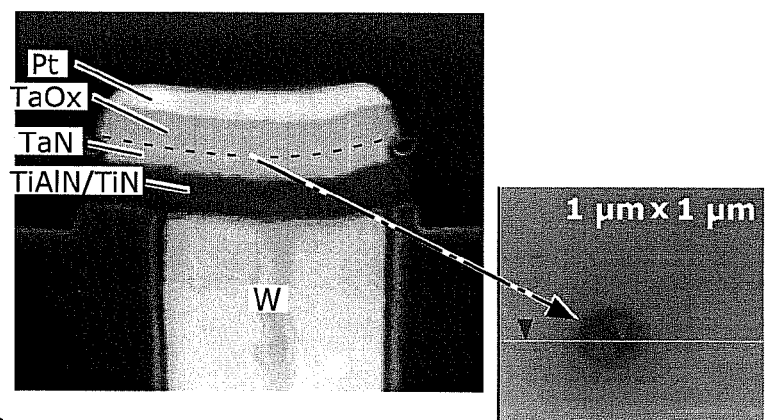
Figure 5:
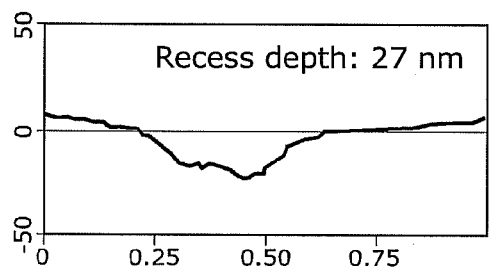
Figure 5:
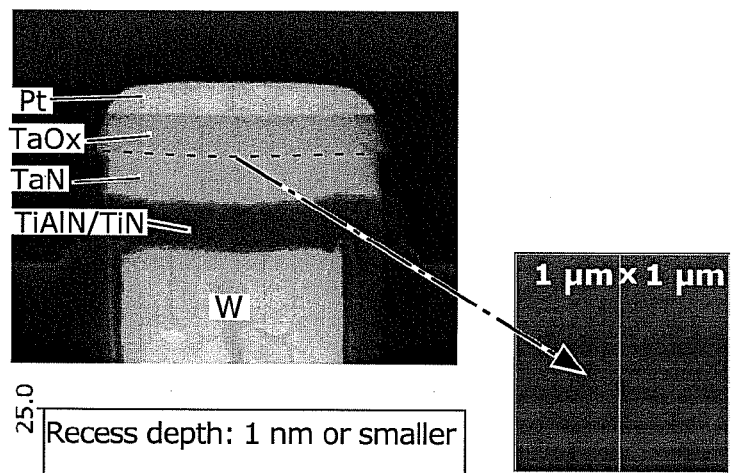
Figure 5:
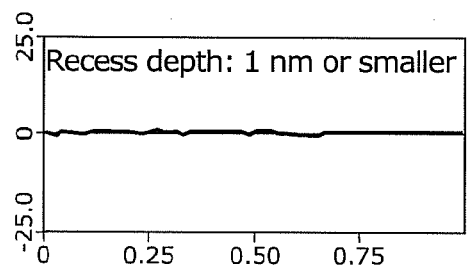

(a) and (b) in FIG. 5 show an example of reduction in the depth of a recess in a semiconductor memory device provided by the present invention.

Figure 6:
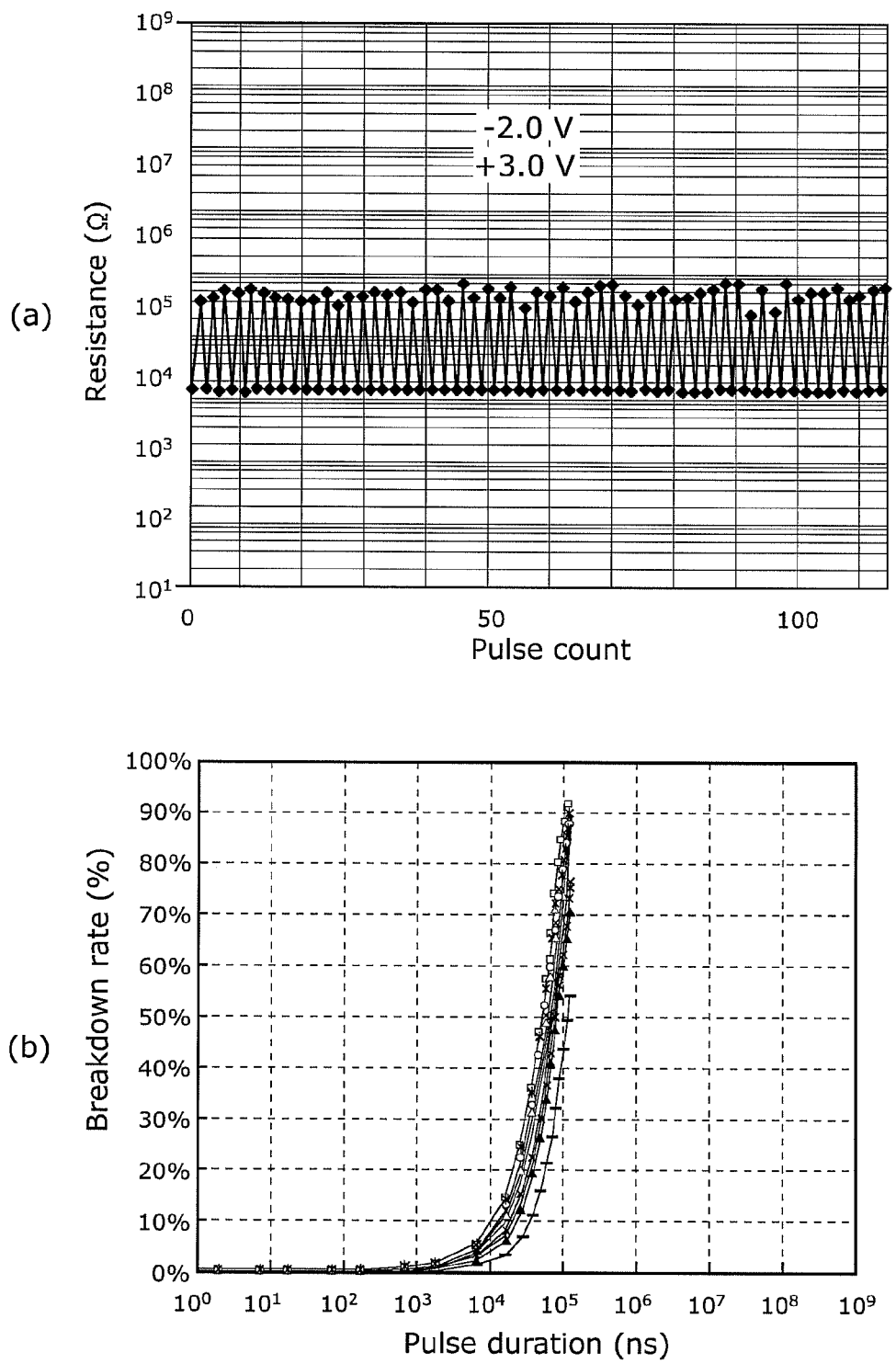

(a) in FIG. 6 is a graph showing resistance change characteristics of the semiconductor memory device according to Embodiment 2 of the present invention, and (b) in FIG. 6 is a graph showing initial breakdown characteristics.

Figure 7:
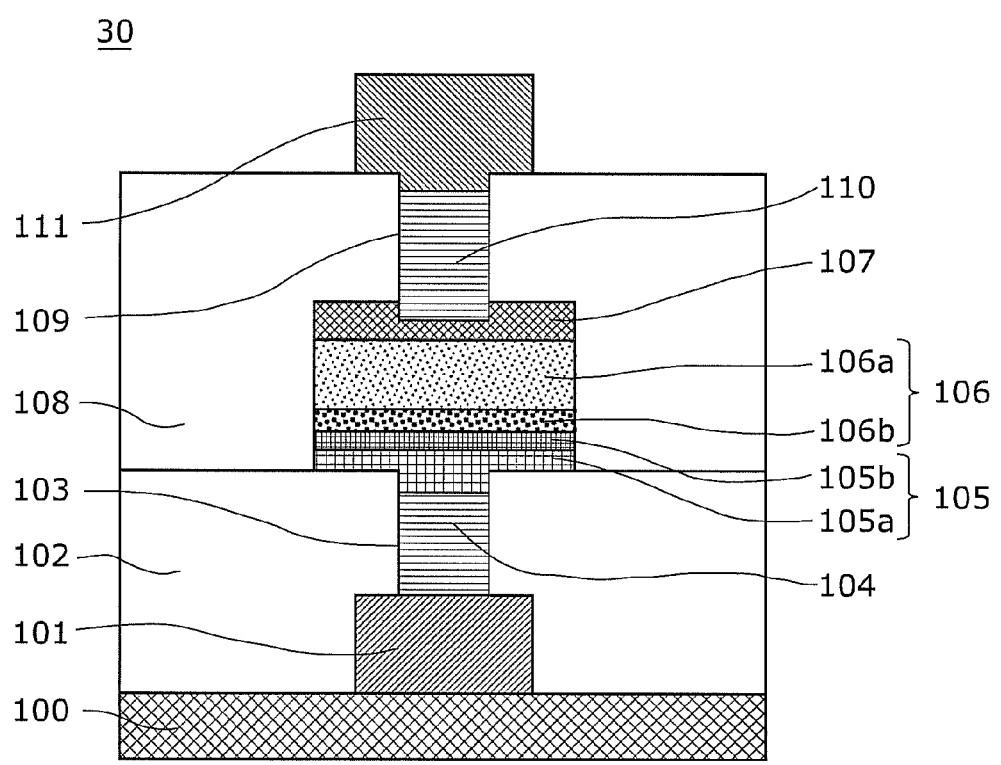

FIG. 7 illustrates a cross-sectional view of an exemplary configuration of a semiconductor memory device according to Embodiment 3 of the present invention.

Figure 8:
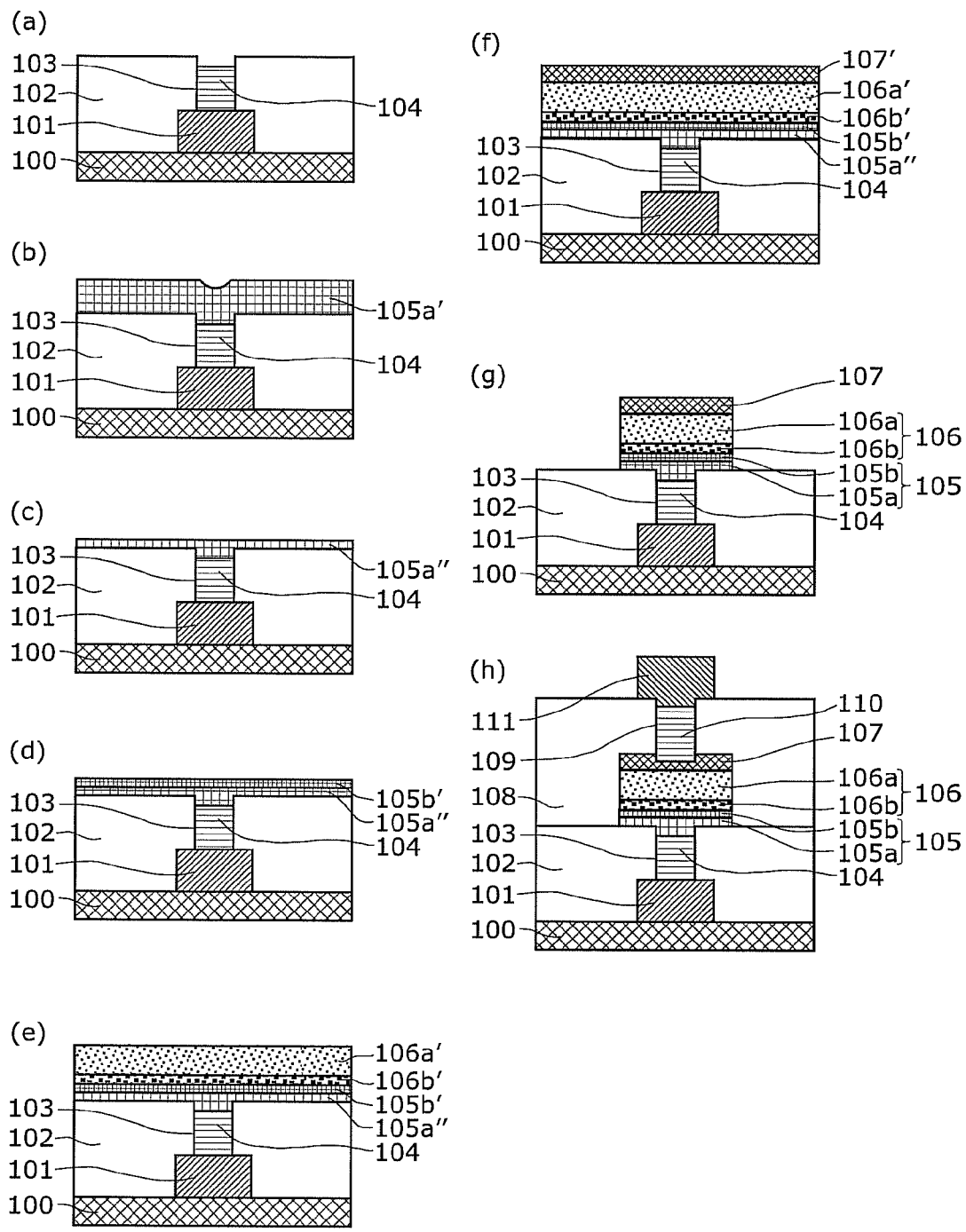

(a) to (h) in FIG. 8 illustrate cross-sectional views for showing a method of manufacturing a main part of the semiconductor memory device according to Embodiment 3 of the present invention.

Figure 9:
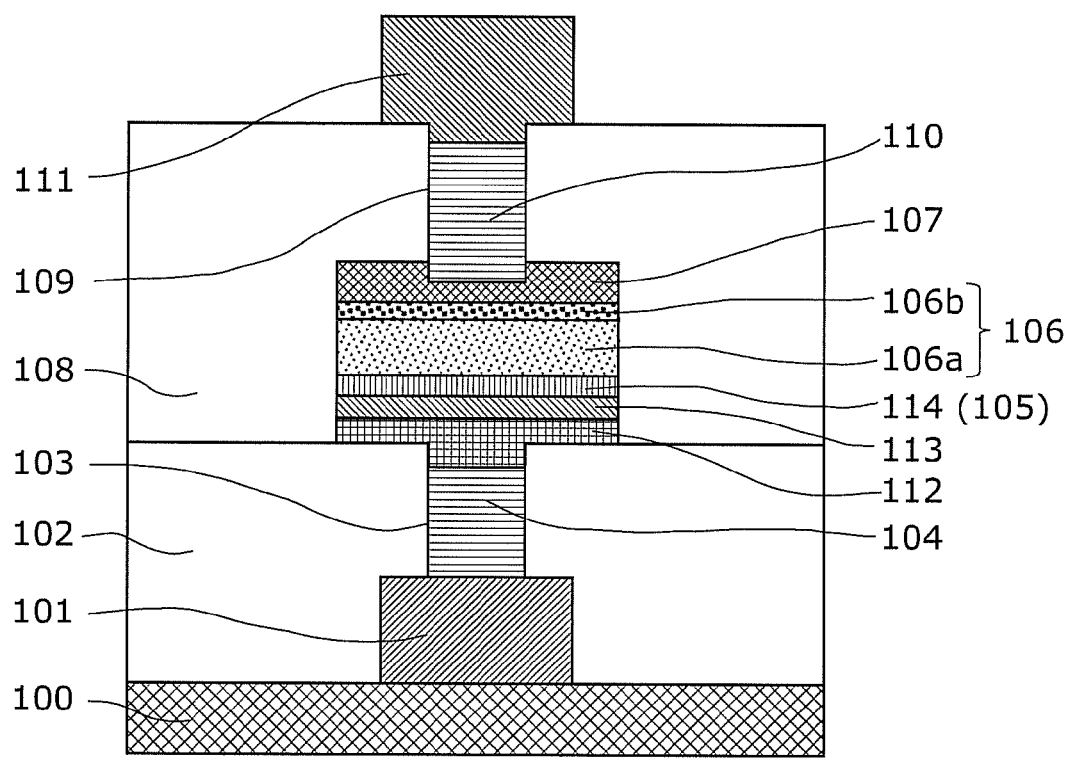

FIG. 9 illustrates a cross-sectional view of an exemplary configuration of a semiconductor memory device according to Embodiment 4 of the present invention.

Figure 10:
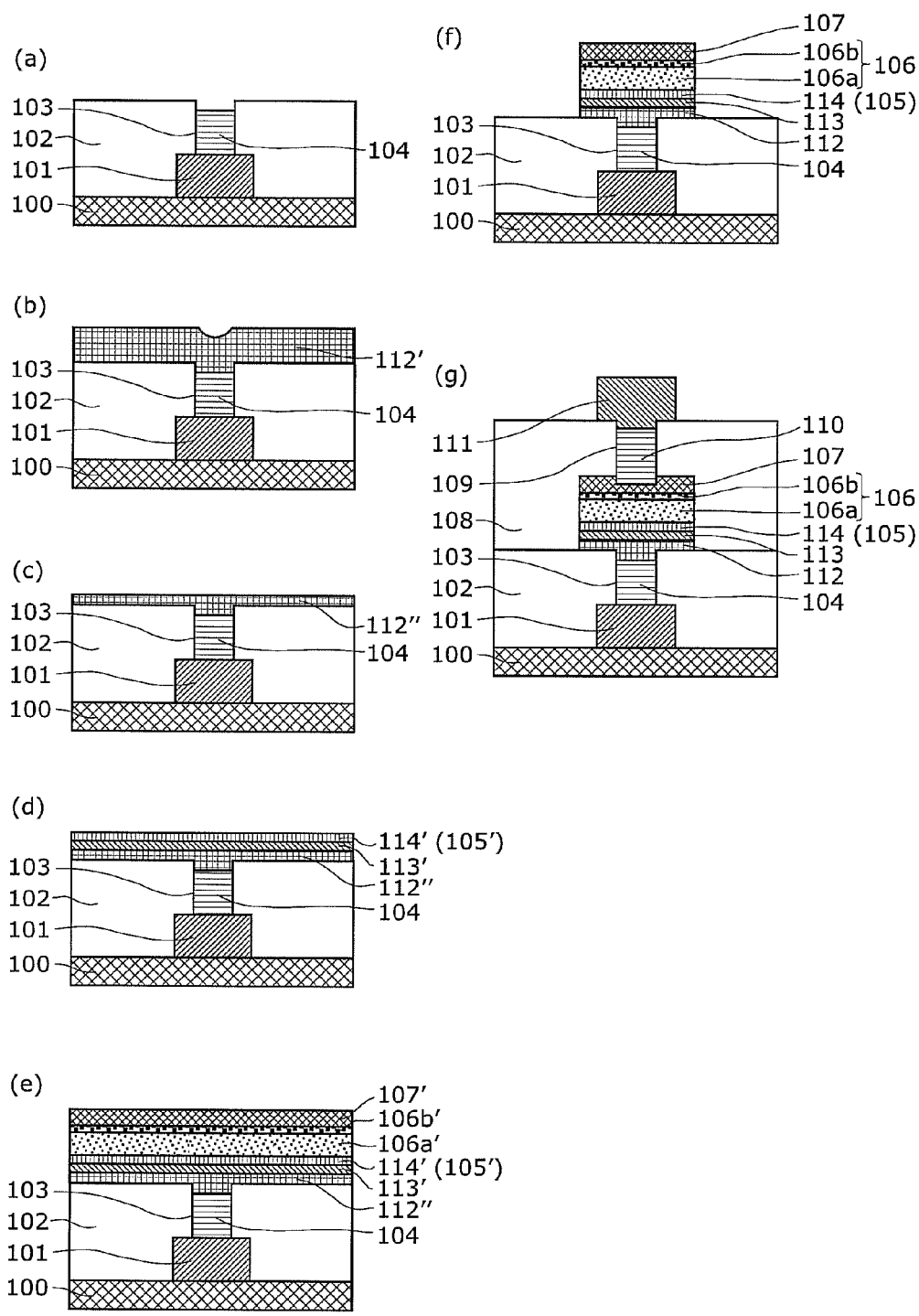

(a) to (g) in FIG. 10 illustrate cross-sectional views for showing a method of manufacturing a main part of the semiconductor memory device according to Embodiment 4 of the present invention.

Figure 11:
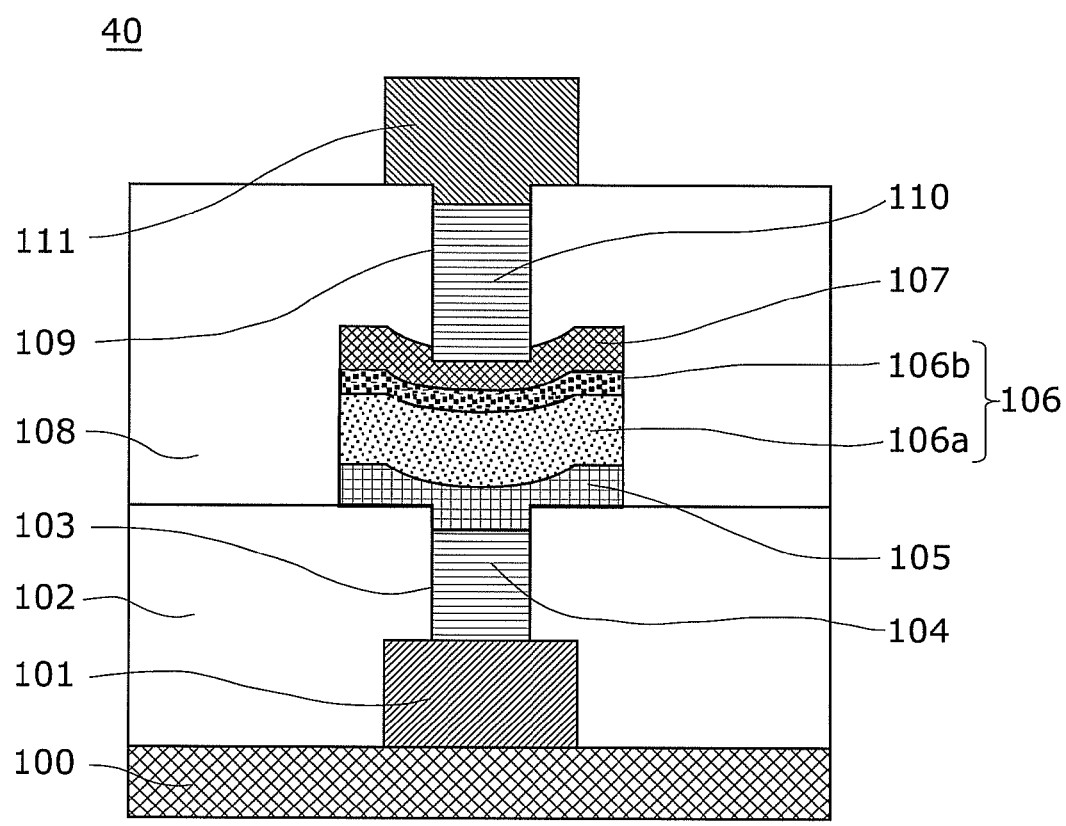

FIG. 11 illustrates a cross-sectional view of an exemplary configuration of a conventional semiconductor memory device.

Figure 12:
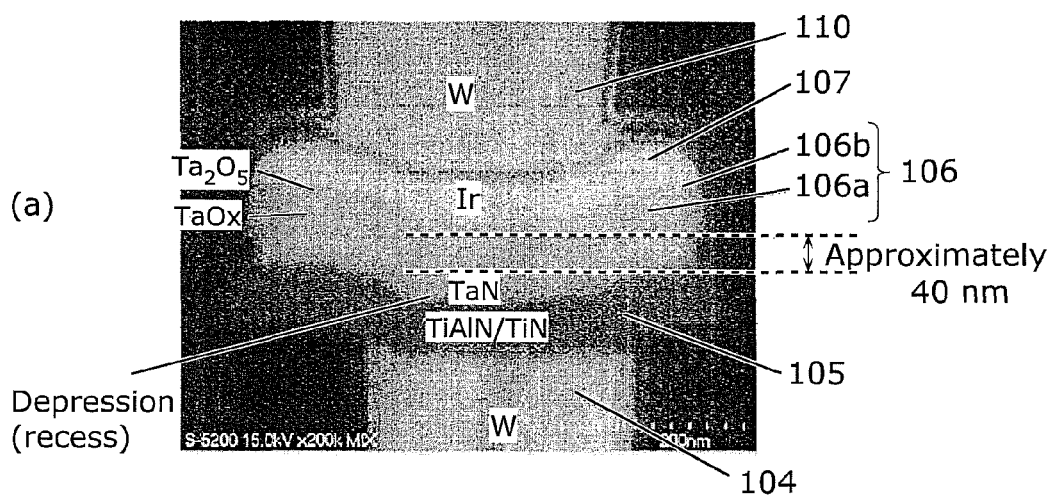
Figure 12:
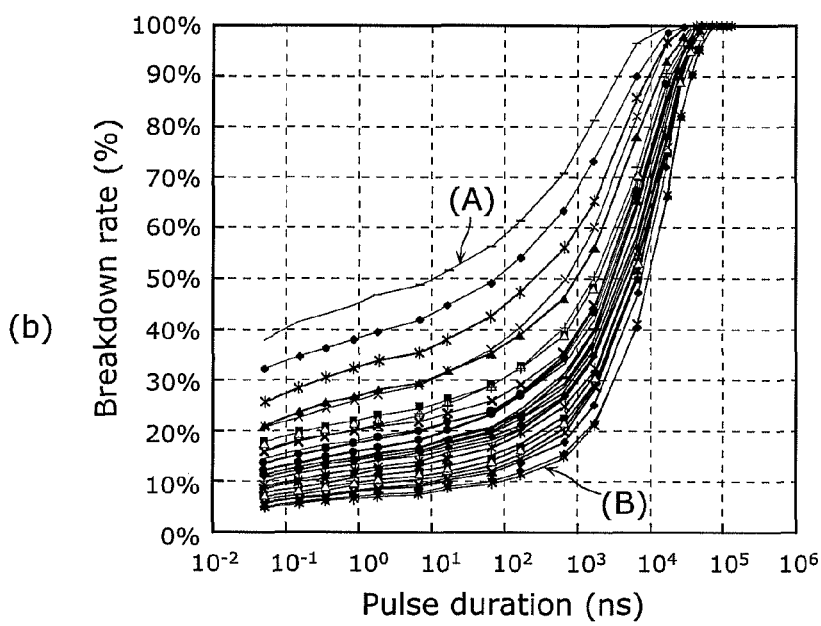

(a) in FIG. 12 illustrates a cross-sectional view of a variable resistance element in the conventional semiconductor memory device. (b) in FIG. 12 is a graph showing initial breakdown characteristics.

DESCRIPTION OF EMBODIMENTS

Hereinafter, variation of resistance change characteristics and the cause thereof determined by the inventors shall be described.

FIG. 11 illustrates a schematic view of a variable resistance semiconductor memory device 40 provided with conventional variable resistance elements among which resistance change characteristics vary. A first line 101 is formed on a substrate 100, and a first interlayer insulating layer 102 is formed covering the first line 101. A first contact hole 103 is formed penetrating through the first interlayer insulating layer 102 down to the first line 101, and a first contact plug 104 is formed inside the first contact hole 103. A variable resistance element including a lower electrode 105, a variable resistance layer 106, and an upper electrode 107 is formed on the first interlayer insulating layer 102, covering the first contact plug 104. A second interlayer insulating layer 108 is formed covering the variable resistance element, and a second contact plug 110 is formed inside a second contact hole 109 penetrating through the second interlayer insulating layer 108. The second contact plug 110 connects the upper electrode 107 and a second line 111. The variable resistance layer 106 is of a stacked structure including a first variable resistance layer 106a and a second variable resistance layer 106b which include the same type of transition metal oxides. The oxygen content percentage of the transition metal oxide in the second variable resistance layer 106b is higher than the oxygen content percentage of the transition metal oxide in the first variable resistance layer 106a. As shown in the schematic view of the variable resistance semiconductor memory device 40 in FIG. 11, the variable resistance element having such varied resistance change characteristics has a depression at the contact between the first contact plug 104 and the lower electrode 105.

FIG. 12 shows a scanning electron microscope (SEM) image of a cross-section of a conventional semiconductor memory device actually having varied resistance change characteristics and the variation in the resistance change characteristics.

(a) in FIG. 12 shows the SEM image of a cross-section of a variable resistance element actually produced as an experimental product for a conventional semiconductor memory device. The first contact plug 104 is made of tungsten. The lower electrode 105 is a stacked structure of, from top down, a layer of tantalum nitride (TaN), a layer of titanium aluminum nitride (TiAlN), and a layer of titanium nitride. The variable resistance layer 106 includes the first variable resistance layer 106a and the second variable resistance layer which are composed of tantalum oxide. The first variable resistance layer 106a has a relatively low oxygen content percentage compared to the second variable resistance layer 106b and is composed of oxygen-deficient $TaO_x$ (0<x<2.5). The variable resistance layer 106b with a height of several nanometers has a relatively high oxygen content percentage and is composed of $TaO_y$ (x<y) where y is usually a value close to 2.5. The upper electrode 107 is composed of iridium, and the second contact plug 110 is composed of tungsten.

As shown in (a) in FIG. 12, a depression is created at the contact between the first contact plug 104 and the lower electrode 105. The depression is hereinafter referred to as a recess. The dimensions of the recess affect the shape of the lower electrode 105. In (a) in FIG. 12, a depression having a depth of approximately 40 nanometers is created in the top surface of the lower electrode 105. The depression in the lower electrode 105 causes a depression in the variable resistance layer 106 on the lower electrode 105.

(b) in FIG. 12 shows a graph showing initial breakdown characteristics of a chip including a plurality of variable resistance elements as shown in (a) in FIG. 12. Here, the initial breakdown refers to a process for bringing the variable resistance layer into a state to be ready to start resistance change. The process is performed by locally short-circuiting part of the second variable resistance layer 106b having the higher oxygen content percentage at the time of the first application of voltage to a variable resistance element after its manufacture. The curves in (b) in FIG. 12 represent breakdown characteristics of different chips. Here, each of the chips includes 256 variable resistance elements for 256 bits.

The horizontal axis in (b) in FIG. 12 indicates cumulative time of pulse voltage (3.3 V) applied to the variable resistance elements (the sum of duration of pulse voltage applied to each of the chips). The vertical axis indicates breakdown rates which are the rates of variable resistance elements successfully broken down in the respective chips. For example, a curve (A), which is the uppermost curve in (b) in FIG. 12, indicates that the breakdown rate is approximately 50% at a pulse duration of 10 nanoseconds. This shows that 128 bits (50%) out of 256 bits of all the variable resistance elements in a chip corresponding to the curve (A) were broken down. In contrast, a curve (B) in FIG. 12 indicates that the breakdown rate is approximately 7% at a pulse duration of 10 nanoseconds. This shows that 17 bits (7%) out of 256 bits of all the variable resistance elements in a chip corresponding to the curve (B) were broken down.

(b) in FIG. 12 thus shows the breakdown rates varied widely among chips even at the same cumulative time of applied pulse voltage. In particular, the variation was large at shorter pulse durations.

The inventors see the following as a cause of the variation.

When the recess was not present, the top surface of the first variable resistance layer 106a above the contact plug was flat. When the recess was present, the shape of the first variable resistance layer 106a reflected the shape of the recess above the contact plug. As a result, the second variable resistance layer 106b was formed to have a desired thickness when a recess was not present, and the second variable resistance layer 106b formed was not as thick as desired when a recess was present. This is because particles sputtered to form the second variable resistance layer 106b on a depressed area cannot reach the points in the depressed area from a solid angle as wide as in the case where the particles are sputtered onto a flat surface. The solid angle for a depressed area becomes smaller as a function of the depth of a recess, and therefore the second variable resistance layer 106b is less thick when the depth of a recess is larger. The second variable resistance layer 106b having smaller thickness makes breakdown of variable resistance elements at shorter pulse durations easier.

The second variable resistance layer 106b having a thickness of as small as several nanometers varied due to variation in the depths of the recesses. The variation in the thickness caused mixture of bits (variable resistance elements) which are broken down by voltage application for shorter pulse durations and bits (variable resistance elements) are broken down by voltage application for longer pulse durations in each of the chips, and the mixture proportion was different from one chip to another. The inventors presumed that this caused the variation in the breakdown rate as shown in (b) in FIG. 12.

Since the variable resistance layer 106b, which dominates most of the resistance value of the variable resistance layer 106, has a small thickness of several nanometers and the thickness is much less than the width of the recess (the crosswise length of the recess part in (a) in FIG. 12), such large variation in the breakdown rate as shown in (b) in FIG. 12 with recesses was a result unpredictable to the inventors who predicted that the variation in thickness of the variable resistance layer 106b would be small even with the recesses.

The variation in pulse duration necessary for breakdown of variable resistance elements also causes the following problem.

When all the bits (variable resistance elements) are broken down by voltage application for longer pulse duration, the bits (variable resistance elements) broken down by voltage application for shorter pulse durations receive excessive electric charges in the longer pulse duration, and therefore the variable resistance elements have a wider variation of resistance change characteristics. When pulse duration is optimized for each bit, the variable resistance elements for bits are uniformly broken down. However, this method is of little practicability for large-capacity memory because it takes large amount of time to conduct a test necessary for optimization of pulse duration for breakdown of all the bits. Furthermore, this method contributes to increase in variation of resistance change characteristics of the variable resistance elements because some of the bits (variable resistance element) can be broken down by voltage application for shorter pulse durations can be easily broken down by, for example, noise before controlling the breakdown.

Hereinafter, embodiments of the present invention to solve the problem shall be described with reference to the drawings.

Embodiment 1

(Device Configuration)

Figure 1:
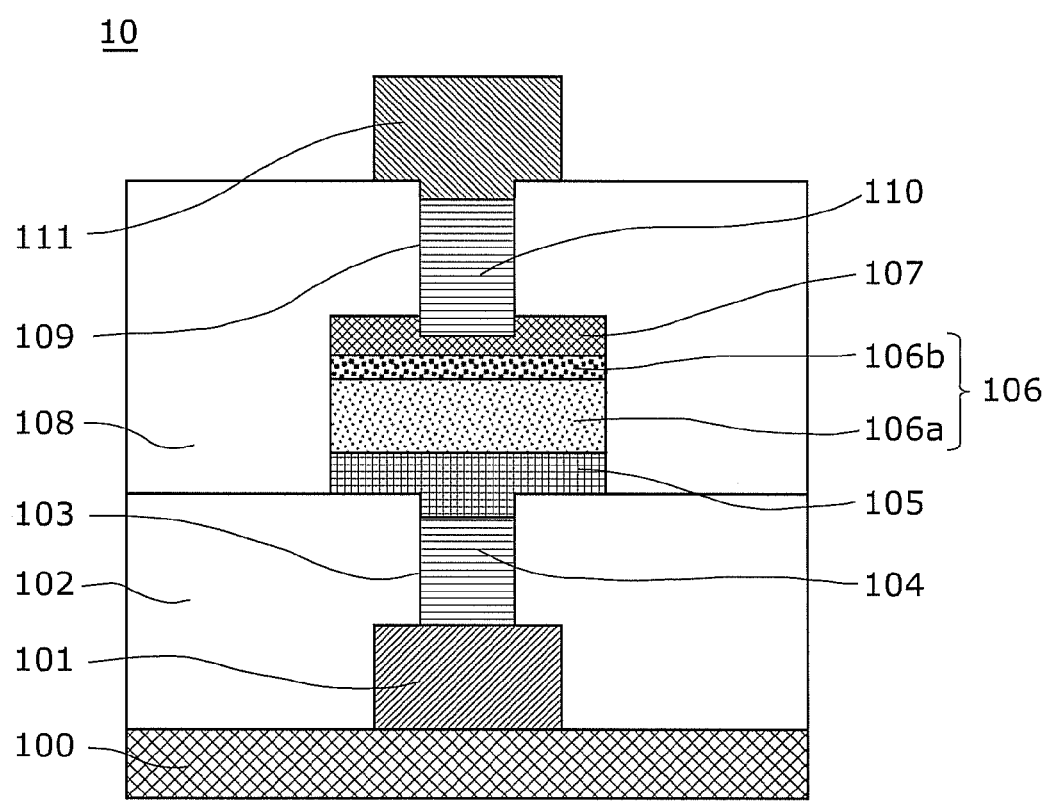
FIG. 1 illustrates a cross-sectional view of an exemplary configuration of a semiconductor memory device according to Embodiment 1 of the present invention.

FIG. 1 illustrates a cross-sectional view of a semiconductor memory device 10 according to Embodiment 1 of the present invention. As shown in FIG. 1, the semiconductor memory device 10 according to Embodiment 1 includes a substrate 100 in which a first line is formed, a first interlayer insulating layer composed of a silicon oxide layer (500 to 1000 nanometers thick, hereinafter dimensions refers to size in the stacking direction unless otherwise noted) on the substrate 100 and covering the first line 101, and a first contact plug 104 containing tungsten as a primary material and foamed inside a first contact hole 103 (50 to 300 nanometers in diameter) penetrating through the first interlayer insulating layer 102 down to the first line 101. The top surface of the first contact plug 104 and the top surface of the first interlayer insulating layer 102 are not continuous, and a recess (5 to 50 nanometers deep) is present in the non-continuous part. In addition, a variable resistance element is formed on the first interlayer insulating layer 102, covering the first contact plug 104. The variable resistance element includes a lower electrode 105 (5 to 100 nanometers thick) composed of tantalum nitride, a variable resistance layer 106 (20 to 100 nanometers thick), and an upper electrode 107 (5 to 100 nanometers thick) composed of a noble metal (platinum, iridium, palladium, and the like). The top surface of the lower electrode 105 is extremely flat even in the direction traversing the first contact plug 104, and thus forms a continuous surface. A second interlayer insulating layer 108 composed of a silicon oxide film (500 to 1000 nanometers thick) is formed, covering the variable resistance element, and a second contact plug 110 containing tungsten as a primary material is formed inside a second contact hole 109 (50 to 300 nanometers in diameter) penetrating through the second interlayer insulating layer 108 down to the upper electrode 107. A second line 111 is formed on the second interlayer insulating layer 108, covering the second contact plug 110.

The variable resistance layer 106 is of a stacked structure including a first variable resistance layer 106a and a second variable resistance layer 106b, and composed of oxygen-deficient transition metal oxide. The oxygen content percentage of the transition metal oxide in the second variable resistance layer 106b is higher than the oxygen content percentage of the transition metal oxide in the first variable resistance layer 106a. The first variable resistance layer 106a may be composed of $TaO_x$ ($0.8 \le x \le 1.9$), and the second variable resistance layer 106b may be composed of $TaO_y$ ($2.1 \le y < 2.5$). Alternatively, the first variable resistance layer 106a may be composed of $HfO_x$ ($0.9 \le x \le 1.6$), and the second variable resistance layer 106b may be composed of HfO$_y$ (1.8<y<2.0). Alternatively, the first variable resistance layer 106a may be composed of ZrO$_x$(0.9≤x≤1.4), and the second variable resistance layer 106b may be composed of ZrO$_y$ (1.9<y<2.0). The first variable resistance layer 106a has a thickness within an approximate range of 10 nanometers to 100 nanometers. The second variable resistance layer 106b has a thickness within an approximate range of 1 nanometer to 10 nanometers.

With this configuration, the formed lower electrode 105 resides also in the recess part above the first contact plug 104 inside the first contact hole 103, and still has a flat top surface. As a result, the lower electrode 105 is thicker above the first contact plug 104 than above the first interlayer insulating layer 102. The favorable flatness of the top surface of the lower electrode 105 reduces variation in the shape and thickness of the variable resistance layer 106 so that the variation of resistance change characteristics can be reduced. In particular, the variation in the thickness of the second variable resistance layer 106b, which is thinner and has a higher oxygen content percentage and higher resistance, is significantly reduced so that initial breakdown can be stabilized. This provides even a large-capacity nonvolatile memory with significantly reduced variation among bits.

It should be noted that in Embodiment 1, the second variable resistance layer 106b having a higher oxygen content percentage is disposed to form the top surface in contact with the upper electrode 107 and a noble metal having a higher standard electrode potential than that of the transition metal composing the variable resistance layer 106 is selected as a material for the upper electrode 107 so that resistance change may occur preferentially at the interface between the variable resistance layer 106 and the upper electrode 107. However, it is also possible the second variable resistance layer 106b having a higher oxygen content percentage is disposed to form the lower surface in contact with the lower electrode 105 and a noble metal having a higher standard electrode potential is used as a material for the lower electrode 105 so that resistance change may occur preferentially at the interface between the variable resistance layer 106 and the lower electrode 105.

(Manufacturing Method)

(a) to (k) in FIG. 2 illustrate cross-sectional views for showing a method of manufacturing a main part of the semiconductor memory device 10 according to Embodiment 1 of the present invention The method of manufacturing the main part of the semiconductor memory device 10 according to Embodiment 1 shall be described using these drawings.

As shown in (a) in FIG. 2, the first line 101 is formed using a process in which a conductive layer (400 to 600 nanometers thick) composed of aluminum is formed on the substrate 100 in which a transistor and an underlying line are formed, and the conductive layer is patterned into the first line 101.

Next, as shown (b) in FIG. 2, the first interlayer insulating layer 102 is formed using a process in which an insulating layer is formed on the substrate 100 so as to cover the first line 101, and then the top surface of the insulating layer is planarized to form the first interlayer insulating layer 102 (500 to 1000 nanometers thick). A plasma TEOS film can be used as the first interlayer insulating layer 102, and a fluorine-containing oxide (for example, FSG) or a low-k material can be used for the first interlayer insulating layer 102 in order to reduce parasitic capacitance between lines.

Next, as shown in (c) in FIG. 2, the first contact hole 103 is formed using a process in which the first interlayer insulating layer 102 is patterned using a desired mask so as to form a first contact hole 103 (50 to 300 nanometers in diameter) penetrating through the first interlayer insulating layer 102 down to the first line 101. Here, when the width of the first line 101 is smaller than the diameter of the first contact hole 103, the area in which the first line 101 and the first contact plug 104 are in contact changes due to the impact of mask misalignment, and thus, for example, variation in cell current may be caused. From the point of view of preventing the variation, the first line 101 is formed to have a width greater than the diameter of the first contact hole 103.

Next, as shown in (d) in FIG. 2, the first contact plug 104 is formed using a process in which first a titanium nitride/titanium (TiN/Ti) layer (5 to 30 nanometers thick) which functions as an adhesion layer and a diffusion barrier is underlaid by sputtering, and a layer (200 to 400 nanometers thick) of tungsten (W), which is the primary material, is overlaid by chemical vapor deposition (CVD). In this process, the first contact hole 103 is filled with a conductive layer 104' (a layer of a material for the first contact plug) of a stacked structure. The conductive layer 104' is to be the first contact plug 104. It should be noted that the shape of the underlying layer is transferred into the top surface of the conductive layer 104' so that a depression (5 to 100 nanometers deep) is created in the top surface above the first contact hole 103.

Next, as shown in (e) in FIG. 2, the first contact plug 104 is formed using a process in which the entire surface of the wafer is planarized by polishing to remove the unnecessary conductive layer 104' on the first interlayer insulating layer 102 by chemical mechanical polishing (CMP) until the first interlayer insulating layer 102 is exposed, and thus the first contact plug 104 is formed inside the first contact hole 103. At this time, the top surface of the first contact plug 104 and the top surface of the first interlayer insulating layer 102 are not continuous, and a recess (5 to 50 nanometers deep) is present in the non-continuous part. This is because, the materials for the first interlayer insulating layer 102 and the materials the first contact plug 104, which are an insulator and a conductor, respectively, are necessarily different, and therefore their polishing rates in the CMP are different. This always occurs when different types of materials are used.

Next, as shown in (f) in FIG. 2, in a process in which the lower electrode 105 is formed, a conductive layer 105' (a lower electrode material film of 50 to 200 nanometers thick) is formed on the first interlayer insulating layer 102 by sputtering so as to cover the first contact plug 104. The conductive layer 105' is composed of tantalum nitride (TaN) and is to be the lower electrode 105. The conductive layer 105' resides also in the recess part above the first contact plug 104 inside the first contact hole 103. Furthermore, in the same manner as describe above, the shape of the underlying layer is transferred into the top surface of the conductive layer 105' so that a depression having is created in the top surface above the first contact plug 104.

Next, as shown in (g) in FIG. 2, in a process in which the lower electrode 105 is formed, a conductive layer 105" (20 to 100 nanometers thick) is formed by planarizing the entire surface of the wafer by chemical mechanical polishing (CMP). The conductive layer 105" is to be the lower electrode 105 after being patterned. The point of this process is that the conductive layer 105' is planarized by polishing until the above-described depression shown in (f) in FIG. 2 disappears, and the conductive layer 105" is left behind throughout the wafer. By using such a manufacturing method, the top surface of the conductive layer 105" is made extremely flat even in the direction traversing the first contact plug 104, and thus forms a continuous surface. This can be achieved because, unlike when the first contact plug 104 is formed, only a single material is polished in the polishing because the polishing of the conductive layer 105" is stopped along the way, and it is therefore possible in principle to avoid performing CMP on a surface having polishing rates varying from place to place.

Next, as shown in (h) in FIG. 2, in a process in which the variable resistance layer 106 is formed, a first variable resistance layer 106a' (a first variable resistance layer material film) composed of a transition metal oxide is formed on the conductive layer 105". The first variable resistance layer 106a' can be composed of, for example, oxygen-deficient tantalum oxide ($TaO_x$, $0<x<2.5$). In this case, the oxygen-deficient tantalum oxide can be composed by what is called reactive sputtering in which a tantalum target is sputtered in an atmosphere containing argon and oxygen gas. The resultant first variable resistance layer 106a' has an oxygen content percentage of 44 to 65 atm %, a resistivity of 2 to 50 mΩcm, and a thickness of 20 to 100 nanometers. Next, a second variable resistance layer 106b' (a second variable resistance layer material film) having an oxygen content percentage higher than that of the first variable resistance layer 106a' is formed on the first variable resistance layer 106a'. The second variable resistance layer 106b' can be also composed of oxygen-deficient tantalum oxide. In this case, the second variable resistance layer 106b' is formed by reactive sputtering in which a tantalum target is sputtered in an oxygen gas atmosphere. The resultant second variable resistance layer 106b' has an oxygen content percentage of 68 to 71 atm %, a resistivity of 1E7 ($10^7$) mΩcm or higher, and a thickness of 3 to 10 nanometers. Although the second variable resistance layer 106b' is formed by reactive sputtering in the above-described process, the variable resistance layer may be provided by forming a transition metal oxide layer having a high oxygen content percentage by plasma-oxidizing the surface of the first variable resistance layer 106a'. It is difficult to form a film containing oxygen at a rate higher than a stoichiometric rate by sputtering. However, a layer of a transition metal oxide having a higher oxygen content percentage can be formed by injecting oxygen into grain boundaries and defects of tantalum oxide by plasma-oxidization. The resulting layer of a transition metal oxide is effective in reduction of leak current. Alternatively, the second variable resistance layer 106b' may be formed by reactive sputtering in which a tantalum oxide target is sputtered in an oxygen gas atmosphere.

Next, as shown in (i) in FIG. 2, in a process in which the upper electrode 107 is formed, a conductive layer 107' (upper electrode material layer) composed of a noble metal (platinum, iridium, palladium, and the like) is formed on the second variable resistance layer 106b'. The conductive layer 107' is to be the upper electrode 107 after being patterned.

Next, as shown in (j) in FIG. 2, a variable resistance element is formed in a process in which the conductive layer 105", the first variable resistance layer 106a, the second variable resistance layer 106b, and the conductive layer 107' are patterned using a desired mask so as to form the variable resistance layer 106 of two stacked layers of the first variable resistance layer 106a and the second variable resistance layer 106b between the lower electrode 105 and the upper electrode 107. Since it is difficult to etch a material having standard electrode potential higher than the transition metal composing the variable resistance layer 106 as typified by noble metals, the variable resistance element can also be formed using an upper electrode as a hard mask when the upper mask is made of such a material. Although the layers are collectively patterned using the same mask in the present process, each of the layers may be patterned in each of the above-described processes.

Finally, as shown in (k) in FIG. 2, the second interlayer insulating layer 108 (500 to 1000 nanometers thick) is formed so as to cover the variable resistance element, and the second contact hole 109 and the second contact plug 110 are formed using the same method as shown in (b) in FIG. 2 and (c) in FIG. 2. Subsequently, the second line 111 is formed so as to cover the second contact plug 110, and the semiconductor memory device 10 is thus completed.

By using the manufacturing method, the top surface of the lower electrode above the recess can be made approximately flat even when a recess is present above the first contact plug. Variation in the shape and thickness of the variable resistance layer is caused only by essential variation in the method of forming the variable resistance layer or the method of oxidization, and are therefore not affected by the shape of the layer underlying the variable resistance layer. Thus, it is possible to significantly reduce variation of resistance change characteristics between each bit caused by the underlying layer, and thus a large-capacity semiconductor memory device can be provided.

Embodiment 2

(Device Configuration)

FIG. 3 illustrates a cross-sectional view of a semiconductor memory device 20 according to Embodiment 2 of the present invention. In FIG. 3, the same numerical signs are used for constituent elements that are the same as in FIG. 1, and description thereof shall be omitted. As shown in FIG. 3, the semiconductor memory device 20 according to Embodiment 2 differs from the semiconductor memory device 10 according to Embodiment 1 in the structure of the lower electrode 105. In the semiconductor memory device 20, the lower electrode 105 is of a stacked structure including a first lower electrode 105a and a second lower electrode 105b. The first lower electrode 105a (5 to 50 nanometers thick) both functions as a diffusion barrier to prevent diffusion of W in the first contact plug 104 and maintains adhesion to the first interlayer insulating layer 102. The first lower electrode 105a is of a stacked structure including a layer of titanium aluminum nitride (TiAlN) and a layer of titanium nitride, for example. The second lower electrode 105b (10 to 50 nanometers thick) is composed of tantalum nitride (TaN) to function as an electrode of a variable resistance element. In the same manner as in the semiconductor memory device 10, the top surface of the lower electrode 105 is extremely flat even in the direction traversing the first contact plug 104, and thus forming a continuous surface.

With this configuration, the formed first lower electrode 105a resides also in the recess part above the first contact plug 104 in the first contact hole 103, and the second lower electrode 105b nevertheless has a flat top surface. As a result, the second lower electrode 105b is thicker above the first contact plug 104 than above the first interlayer insulating layer 102. The favorable flatness of the top surface of the lower electrode 105 reduces variation in the shape and thickness of the variable resistance layer 106 so that the variation of resistance change characteristics can be reduced.

In particular, the variation in the thickness of the second variable resistance layer 106b, which is thinner and has a higher oxygen content percentage and higher resistance, is reduced so that initial breakdown can be stabilized. This provides even a large-capacity nonvolatile memory with significantly reduced variation among bits.

(Manufacturing Method)

(a) to (h) in FIG. 4 illustrate cross-sectional views showing a method of manufacturing a main part of the semiconductor memory device 20 according to Embodiment 2 of the present invention. The method of manufacturing the main part of the semiconductor memory device 20 according to Embodiment 2 shall be described using these drawings. Processes preceding the process shown in (a) in FIG. 4 are the same as shown in (a) to (d) in FIG. 2, and thus description thereof shall be omitted.

As shown in (a) in FIG. 4, the first contact plug 104 is formed using a process in which the entire surface of the wafer is planarized by polishing to remove the unnecessary conductive layer 104' on the first interlayer insulating layer by CMP, and thus the first contact plug 104 is formed inside the first contact hole 103. At this time, the top surface of the first contact plug 104 and the top surface of the first interlayer insulating layer 102 are not continuous, and a recess (5 to 50 nanometers deep) is present in the non-continuous part.

Next, as shown in (b) in FIG. 4, in a process in which the first lower electrode 105a is formed, a conductive layer 105a' (a first lower electrode material film of 20 to 50 nanometers thick) is formed on the first interlayer insulating layer 102 by sputtering so as to cover the first contact plug 104. The conductive layer 105a' is of a stacked structure including a layer of titanium aluminum nitride (TiAlN) and a layer of titanium nitride (TiN) and is to be the first lower electrode 105a. Here, the layer of titanium nitride (TiN) is formed as an adhesion layer on the first contact plug 104. The conductive layer 105a' resides also in the recess part above the first contact plug 104 inside the first contact hole 103. Furthermore, in the same manner as describe above, the shape of the underlying layer is transferred into the top surface of the conductive layer 105a' so that a depression having is created in the top surface above the first contact plug 104.

Next, as shown in (c) in FIG. 4, in a process in which the second lower electrode 105b is formed, a conductive layer 105b' (a second lower electrode material film of 50 to 200 nanometers thick) is formed on the first lower electrode 105a' by sputtering. The conductive layer 105b' is composed of tantalum nitride (TaN) and is to be the second lower electrode 105b. In the same manner as before, the shape of the underlying layer is transferred into the top surface of the conductive layer 105b' so that a depression having is created in the top surface above the first contact plug 104.

Next, as shown in (d) in FIG. 4, in a process in which the second lower electrode 105b is formed, a conductive layer 105b'' (20 to 100 nanometers thick) is formed by planarizing the entire surface of the wafer by chemical mechanical polishing (CMP). The conductive layer 105b'' is to be the second lower electrode 105b after being patterned. The point of this process is that the conductive layer 105b' is planarized by polishing until the above-described depression shown in (c) in FIG. 4 disappears, and the conductive layer 105b'' is left behind throughout the wafer. By using such a manufacturing method, the top surface of the conductive layer 105b'' is made extremely flat even in the direction traversing the first contact plug 104, and thus forms a continuous surface. This can be achieved because, unlike when the first contact plug 104 is formed, only a single material is polished in the polishing because the polishing of the conductive layer 105b'' is stopped along the way, and it is therefore possible in principle to avoid performing CMP on a surface having polishing rates varying from place to place.

The processes shown in (e) to (h) in FIG. 4 following the process shown in (d) in FIG. 4 are the same as shown in (h) to (k) in FIG. 2, and thus description thereof shall be omitted.

EXAMPLE (a) and (b) in FIG. 5 show an example of reduction in the depth of a recess in the semiconductor memory device 20 provided by the present invention. (a) in FIG. 5 illustrates a cross-sectional view of the semiconductor memory device 40, and (b) in FIG. 5 illustrates a cross-sectional view of the semiconductor memory device 20 in process immediately after the variable resistance element is formed according to Embodiment 2 of the present invention. In both of the semiconductor memory devices, the lower electrode is of a stacked structure including a layer of tantalum nitride (TaN), a layer of titanium aluminum nitride (TiAlN), and a layer of titanium nitride (TiN), the variable resistance layer is composed of the tantalum oxide ($TaO_x$), and the upper electrode is composed of platinum (Pt). The signal graph shown in the lower part of each of (a) and (b) in FIG. 5 was obtained using an atomic force microscope (AFM) after the conductive layer to be the lower electrode is formed. In the conventional semiconductor memory device 40, a conductive layer was simply formed, whereas in the semiconductor memory device 20 according to an aspect of the present invention, the top surface of the lower electrode was planarized as shown in (d) in FIG. 4. As shown in FIG. 5, the lower electrode in the conventional semiconductor memory device 40 has a depression having a depth of 27 nanometers, reflecting the recess above the first contact plug 104, and the lower electrode in the semiconductor memory device 20 according to an aspect of the present invention has an approximately flat top surface with no recess.

(a) in FIG. 6 is a graph showing resistance change characteristics of the semiconductor memory device 20 according to Embodiment 2 of the present invention. The semiconductor memory device 20 (with an upper electrode of iridium) sampled was formed according to the processes shown in FIG. 4. Pulse voltage of −2.0 V (for decreasing resistance) and +3.0 V (for increasing resistance) with respect to the lower electrode was applied to the upper electrode. The vertical axis indicates resistance values of the variable resistance element, and the horizontal axis indicates pulse counts. (a) in FIG. 6 shows that the resistance stably changed by one order of magnitude or more for more than 100 times of pulse voltage application.

(b) in FIG. 6 is a graph showing initial breakdown characteristics of 256 bits of the sampled semiconductor memory device 20. The horizontal axis indicates pulse durations for application of a pulse voltage (3.3 V), and the vertical axis indicates cumulative breakdown rates until breakdown of all of the 256 bits was completed. The curves represent breakdown characteristics of different chips. (b) in FIG. 6 shows that the variation in time required for breakdown of all of the 256 bits was significantly reduced.

Embodiment 3

(Device Configuration)

FIG. 7 illustrates a cross-sectional view of a semiconductor memory device 30 according to Embodiment 3 of the present invention. In FIG. 7, the same numerical signs are used for elements that are the same as in FIG. 3, and description thereof shall be omitted. As shown in FIG. 7, in the same manner in the semiconductor memory device 20 according to Embodiment 2, the semiconductor memory device 30 according to Embodiment 3 is of a stacked structure including the first lower electrode 105a and the second lower electrode 105b. However, the semiconductor memory device 30 is different from the semiconductor memory device 20 in that both of the top surface of the first lower electrode 105a and the top surface of the second lower electrode 105b are flat. This is achieved by a configuration in which a conductive material that allows easy planarization of the top surface is disposed as a lower layer and a conductive material that serves an electrode of a variable resistance element is disposed as an upper layer.

With this configuration, the formed first lower electrode 105a resides also in the recess part above the first contact plug 104 in the first contact hole 103, and the top surface of the first lower electrode 105a can be nevertheless made flat. As a result, the first lower electrode 105a is thicker above the first contact plug 104 than above the first interlayer insulating layer 102. The favorable flatness of the top surface of the lower electrode reduces variation in the shape and thickness of the variable resistance layer 106 so that the variation of resistance change characteristics can be reduced. In particular, the variation in the thickness of the second variable resistance layer 106b, which is thinner and has a higher oxygen content percentage and higher resistance, is reduced so that initial breakdown can be stabilized. This provides even a large-capacity nonvolatile memory with significantly reduced variation among bits.

(Manufacturing Method)

(a) to (h) in FIG. 8 illustrates cross-sectional views showing a method of manufacturing main parts of the semiconductor memory device 30 in Embodiment 3 of the present invention. The method of manufacturing the main part of the semiconductor memory device 30 according to Embodiment 3 shall be described using these drawings. Processes preceding the process shown in (a) in FIG. 8 are the same as shown in (a) to (d) in FIG. 2, and thus description thereof shall be omitted.

As shown in (a) in FIG. 8, the first contact plug 104 is formed using a process in which the entire surface of the wafer is planarized by polishing to remove the unnecessary conductive layer 104' on the first interlayer insulating layer by CMP, and thus the first contact plug 104 is formed inside the first contact hole 103. At this time, the top surface of the first contact plug 104 and the top surface of the first interlayer insulating layer 102 are not continuous, and a recess (5 to 50 nanometers deep) is created in the non-continuous part.

Next, as shown in (b) in FIG. 8, in a process in which the first lower electrode 105a is formed, a conductive layer 105a' (a first lower electrode material film of 50 to 200 nanometers thick) is formed on the first interlayer insulating layer 102 by sputtering so as to cover the first contact plug 104. The conductive layer 105a' is of a stacked structure including a layer of tantalum nitride and is to be the first lower electrode 105. The conductive layer 105a' resides also in the recess part above the first contact plug 104 inside the first contact hole 103. Furthermore, the shape of the underlying layer is transferred into the top surface of the conductive layer 105a' so that a depression having is created in the top surface above the first contact plug 104.

Next, as shown in (d) in FIG. 4, in a process in which the second lower electrode 105a is formed, a conductive layer 105a" (20 to 100 nanometers thick) is formed by planarizing the entire surface of the wafer by chemical mechanical polishing (CMP). The conductive layer 105a" is to be the first lower electrode 105a after being patterned. The point of this process is that the conductive layer 105a' is planarized by polishing until the above-described depression shown in (b) in FIG. 8 disappears, and the conductive layer 105a" is left behind throughout the wafer. By using such a manufacturing method, the top surface of the conductive layer 105a" is made extremely flat even in the direction traversing the first contact plug 104, and thus forms a continuous surface. This can be achieved because, unlike when the first contact plug 104 is formed, only a single material is polished in the polishing because the polishing of the conductive layer 105a" is stopped along the way, and it is therefore possible in principle to avoid performing CMP on a surface having polishing rates varying from place to place.

Next, as shown in (d) in FIG. 8, in a process in which the second lower electrode 105b is formed, a conductive layer 105b' (50 to 200 nanometers thick) is formed on the first lower electrode 105a" by sputtering. The conductive layer 105b' is composed of a noble metal (platinum, iridium, palladium, and the like) and is to be the second lower electrode 105b.

Next, as shown in (e) in FIG. 8, in a process in which the variable resistance layer 106 is formed, a second variable resistance layer 106b' composed of a transition metal oxide is formed on the conductive layer 105b'. In this case, the second variable resistance layer 106b' is formed by what is called reactive sputtering in which a tantalum target is sputtered in an argon and oxygen gas atmosphere. The resultant second variable resistance layer 106b' has an oxygen content percentage of 68 to 71 atm %, a resistivity of 1E7 ($10^7$) mΩcm or higher, and a thickness of 3 to 10 nanometers. Furthermore, a layer of a transition metal oxide having the highest oxygen content percentage may be formed by plasma-oxidizing the film of the transition metal oxide formed by reactive sputtering. It is difficult to form a film containing oxygen at a rate higher than a stoichiometric rate by sputtering. However, a layer of a transition metal oxide having a higher oxygen content percentage can be formed by injecting oxygen into grain boundaries and defects of tantalum oxide by plasma-oxidization. The resulting layer of a transition metal oxide is effective in reduction of leak current. Alternatively, a layer of a transition metal oxide may be formed by reactive sputtering in which a tantalum oxide target is sputtered in an oxygen gas atmosphere. Next, a first variable resistance layer 106a' having an oxygen content percentage lower than that of the second variable resistance layer 106b' is formed on the second variable resistance layer 106b'. The first variable resistance layer 106a' is also formed by reactive sputtering a tantalum target in an oxygen gas atmosphere. The resultant first variable resistance layer 106a' has an oxygen content percentage of 44 to 65 atm %, a resistivity of 2 to 50 mΩcm, and a thickness of 20 to 100 nanometers.

Next, as shown in (f) in FIG. 8, in a process in which the upper electrode 107 is formed, a conductive layer 107' composed of tantalum nitride is formed on the first variable resistance layer 106a'. The conductive layer 107' is to be the upper electrode 107 after being patterned.

Next, as shown in (g) in FIG. 8, a variable resistance element is formed in a process in which the conductive layer 105a", the conductive layer 105b, the second variable resistance layer 106b, the first variable resistance layer 106a, and the conductive layer 107' are patterned using a desired mask so as to form a variable resistance layer 106 of two stacked layers of the second variable resistance layer 106b and the first variable resistance layer 106a between the lower electrode 105 and the upper electrode 107. Although the layers are collectively patterned using the same mask in the present process, each of the layers may be patterned in each of the above-described processes.

Finally, as shown in (h) in FIG. 8, a second interlayer insulating layer 108 (500 to 1000 nanometers thick) is formed so as to cover the variable resistance element, and a second contact hole 109 and a second contact plug 110 are formed using the same method as shown in (b) in FIG. 2 and (c) in FIG. 2. Subsequently, a second line 111 is formed so as to the second contact plug 110, and a semiconductor memory device is thus completed.

By using the manufacturing method, the top surface of the lower electrode above the recess can be made approximately flat even when there is a recess above the first contact plug. Variation in the shape and thickness of the variable resistance layer is caused only by essential variation in the method of forming the variable resistance layer or the method of oxidization, and are therefore not affected by the shape of the layer underlying the variable resistance layer. Thus, it is possible to significantly reduce variation of resistance change characteristics between each bit caused by the underlying layer, and thus a large-capacity semiconductor memory device can be provided. Furthermore, with the configuration in which the lower electrode is composed of a plurality of layers including a lower layer of a conductive material that allows easy planarization of the top surface and an upper layer of a conductive material that serves as an electrode of a variable resistance element, the range of material options is dramatically expanded.

Embodiment 4

(Device Configuration)

FIG. 9 illustrates a cross-sectional view of a semiconductor memory device 35 in Embodiment 4 of the present invention. In FIG. 9, the same numerical signs are used for elements that are the same as in FIG. 1, and description thereof shall be omitted.

As shown in FIG. 9, the semiconductor memory device 35 according to Embodiment 4 includes the lower electrode 105 of the variable resistance element having a planarized top surface in the same manner as in the semiconductor memory device 10 according to Embodiment 1. However, the semiconductor memory device 35 is different from the semiconductor memory device 10 according to Embodiment 1 in that the semiconductor memory device 35 includes a diode element below the variable resistance element. The diode element is composed of a lower electrode 112 of the diode element, a semiconductor layer 113, and an upper electrode 114 of the diode element. In other words, the semiconductor memory device 35 includes an element formed by integrating a variable resistance element and a diode element. Although the semiconductor memory device 35 has a structure in which a layer functions both as the upper electrode 114 of the diode element and the lower electrode 105 of the variable resistance element, these electrodes may be provided separately. Here, the top surface of the lower electrode 112 of the diode element is flat, and the semiconductor layer 113, a first variable resistance layer 106a, and a second variable resistance layer 106b formed thereabove each have approximately flat top surfaces.

With this configuration, the formed lower electrode 112 of the diode element resides also in the recess part above the first contact plug 104 in the first contact hole 103, and the top surface of the lower electrode 112 of the diode element can be nevertheless made flat. As a result, the lower electrode 112 of the diode element is thicker above the first contact plug 104 than above the first interlayer insulating layer 102.

With the favorable flatness of the top surface of the lower electrode of the diode element, the semiconductor layer 113 can be made approximately flat so that generation of local leakage paths can be prevented and decrease in rectification properties is thereby avoided. Accordingly, the bit not selected has such a small leakage current that writing in and reading from selected bits can be performed without being affected by such current leakage. It is therefore possible to increase the array size of memory devices for further increase in integration density and capacity.

Furthermore, the favorable flatness of the top surface of the lower electrode of the variable resistance element thereabove reduces variation in the shape and thickness of the variable resistance layer 106 so that the variation of resistance change characteristics can be reduced. In particular, the variation in the thickness of the second variable resistance layer 106b, which is thinner and has a higher oxygen content percentage and higher resistance, is reduced so that initial breakdown can be stabilized. This provides even a large-capacity nonvolatile memory with significantly reduced variation among bits.

(Manufacturing Method)

(a) to (g) in FIG. 10 illustrates cross-sectional views showing a method of manufacturing a main part of the semiconductor memory device 35 in Embodiment 4 of the present invention. The method of manufacturing the main part of the semiconductor memory device 35 according to Embodiment 4 shall be described using these drawings. Processes preceding (a) in FIG. 10 are the same as shown in FIG. 2 (*a*) to (*d*), and thus description thereof shall be omitted.

As shown in (a) in FIG. 10, a first contact plug 104 is formed using a process in which the entire surface of the wafer is planarized by polishing to remove an unnecessary conductive layer 104' on the first interlayer insulating layer by CMP, and thus the first contact plug 104 is formed inside the first contact hole 103. At this time, the top surface of the first contact plug 104 and the top surface of a first interlayer insulating layer 102 are not continuous, and a recess (5 to 50 nanometers deep) is created in the non-continuous part.

Next, as shown in (b) in FIG. 10, in a process in which the lower electrode 112 of the diode element is formed, a conductive layer 112' (for example, a layer composed of tantalum nitride and having a thickness of 50 to 200 nanometers) is formed on the first interlayer insulating layer 102 by sputtering so as to cover the first contact plug 104. The conductive layer 112' is to be the lower electrode 112 of the diode element. The conductive layer 112' resides also in the recess part above the first contact plug 104 inside the first contact hole 103. Furthermore, the shape of the underlying layer is transferred into the top surface of the conductive layer 112' so that a depression having is created in the top surface above the first contact plug 104.

Next, as shown in (c) in FIG. 10, in a process in which the lower electrode 112 of the diode element is formed, a conductive layer 112" (20 to 100 nanometers thick) is formed by planarizing the entire surface of the wafer by chemical mechanical polishing (CMP). The conductive layer 112" is to be the lower electrode 112 of the diode element after being patterned. The point of this process is that the conductive layer 112' is planarized by polishing until the above-described depression shown in (b) in FIG. 10 disappears, and the conductive layer 112" is left behind throughout the wafer. By using such a manufacturing method, the top surface of the conductive layer 112" is made extremely flat even in the direction traversing the first contact plug 104, and thus forms a continuous surface. This can be achieved because, unlike when the first contact plug 104 is formed, only a single material is polished in the polishing because the polishing of the conductive layer 112″ is stopped along the way, and it is therefore possible in principle to avoid performing CMP on a surface having polishing rates varying from place to place.

Next, as shown in (d) in FIG. 10, in a process in which the semiconductor layer 113 and the upper electrode 114 of the diode element are formed, a semiconductor layer 113' is deposited on the conductive layer 112″, and the conductive layer 114' is further deposited on the semiconductor layer 113'. The conductive layer 114' is to be the upper electrode of the diode element. The semiconductor layer 113' is formed by depositing, for example, a 5 to 30 nanometer thick layer of nitrogenized silicon (silicon nitride) by sputtering silicon nitride. Furthermore, the conductive layer 114' to be the upper electrode of the diode element is formed by depositing, for example, 20 to 50 nanometers of tantalum nitride by sputtering. The upper electrode 114 of the diode element also may be configured to serve as the lower electrode 105 of the variable resistance element.

Next, as shown in (e) in FIG. 10, in a process in which a variable resistance layer 106 and an upper electrode 107 are formed, a first variable resistance layer 106a' composed of a transition metal oxide is formed on the conductive layer 114' (105'). Here, the first variable resistance layer 106a' composed of tantalum oxide, which is the transition metal oxide, is formed by what is called reactive sputtering in which a tantalum target is sputtered in an argon and oxygen gas atmosphere. The resultant first variable resistance layer 106a' has an oxygen content percentage of 44 to 65 atm %, a resistivity of 2 to 50 mΩcm, and a thickness of 20 to 100 nanometers. Next, a second variable resistance layer 106b' having an oxygen content percentage higher than that of the first variable resistance layer 106a' is formed on the first variable resistance layer 106a'. The second variable resistance layer 106b' is formed by reactive sputtering a tantalum target in an oxygen gas atmosphere in a manner similar to the process of forming the first variable resistance layer 106a'. The resultant second variable resistance layer 106b' has an oxygen content percentage of 68 to 71 atm %, a resistivity of 1E7 ($10^7$) mΩcm or higher, and a thickness of 3 to 10 nanometers. Furthermore, a layer of a transition metal oxide having the highest oxygen content percentage may be formed by plasma-oxidizing the layer of the transition metal oxide formed by reactive sputtering. It is difficult to form a film containing oxygen at a rate higher than a stoichiometric rate by sputtering. However, a layer of a transition metal oxide having a higher oxygen content percentage can be formed by injecting oxygen into grain boundaries and defects of tantalum oxide by plasma-oxidization. The resulting layer of a transition metal oxide is effective in reduction of leak current. Alternatively, a layer of a transition metal oxide may be formed by reactive sputtering in which a tantalum oxide target is sputtered in an oxygen gas atmosphere. Next, a conductive layer 107' composed of tantalum nitride is formed on the second variable resistance layer 106b'. The conductive layer 107' is to be the upper electrode 107 after being patterned.

Next, as shown in (f) in FIG. 10, a diode element and a variable resistance element are integrally formed in a process in which the conductive layer 112″, the semiconductor layer 113, the conductive layer 114, the first variable resistance layer 106a, the second variable resistance layer 106b, and the conductive layer 107' are patterned using a desired mask so as to form the diode element including the semiconductor layer 113 between electrodes, and form the variable resistance element including the variable resistance layer 106 of two stacked layers between electrodes. Although the layers are collectively patterned using the same mask in the present process, each of the layers may be patterned in each of the above-described processes.

Finally, as shown in (g) in FIG. 10, a second interlayer insulating layer 108 (500 to 1000 nanometers thick) is formed so as to cover the variable resistance element, and a second contact hole 109 and a second contact plug 110 are formed using the same method as shown in (b) in FIG. 2 and (c) in FIG. 2. Subsequently, a second line 111 is formed so as to cover the second contact plug 110, and the semiconductor memory device is thus completed.

By using the manufacturing method, the top surface of the lower electrode of the diode element above the recess can be made approximately flat even when there is a recess above the first contact plug. Variation in the shape and thickness of the semiconductor layer or the variable resistance layer is caused only by essential variation in the method of forming the semiconductor layer or the variable resistance layer or the method of oxidization, and are therefore not affected by the shape of the layer underlying either of the semiconductor layer and the variable resistance layer. Thus, it is possible to prevent increase in local current leakage in a diode and significantly reduce variation of resistance change characteristics, and thus a large-capacity semiconductor memory device can be provided.

It should be noted although the first variable resistance layer and the second variable resistance layer in the above embodiments have been described as being of a stacked structure including layers of tantalum oxide, hafnium oxide, or zirconium oxide for illustrative purposes, the layers may be composed of another transition metal oxide. Provided in the present invention are the structure in which the top surface of the lower electrode is flat in principle and the method for providing the structure. The present invention thus produces an advantageous effect that variation in the shape and thickness of the variable resistance layers is reduced and variation of resistance change characteristics is thereby reduced. It is obvious from such mechanism that the advantageous effect of the present invention is not produced only when the variable resistance layers are composed of tantalum oxide, hafnium oxide, or zirconium oxide.

INDUSTRIAL APPLICABILITY

The present invention provides a variable-resistance semiconductor memory device and a method of manufacturing the variable-resistance semiconductor memory device, and is useful in various electronic device fields that use a nonvolatile memory because the provided nonvolatile memory device operates in a stable manner and is highly reliable.

REFERENCE SIGNS LIST

10 Variable resistance semiconductor memory device in Embodiment 1 of the present invention
20 Variable resistance semiconductor memory device in Embodiment 2 of the present invention
30 Variable resistance semiconductor memory device in Embodiment 3 of the present invention
35 Variable resistance semiconductor memory device in Embodiment 4 of the present invention 40 Conventional variable resistance semiconductor memory device
100 Substrate
101 First line
102 First interlayer insulating layer
103 First contact hole
104 First contact plug
104' Conductive layer to become first contact plug
105 Lower electrode
105, 105" Conductive layer (lower electrode material film) to become lower electrode
105a First lower electrode
105a', 105a" Conductive layer (first lower electrode material film) to become first lower electrode
105b Second lower electrode
105b', 105b" Conductive layer (second lower electrode material film) to become second lower electrode
106 Variable resistance layer
106a, 106a' First variable resistance layer (first variable resistance layer material film)
106b, 106b' Second variable resistance layer (second variable resistance layer material film)
107 Upper electrode
107' Conductive layer (upper electrode material film) to become upper electrode
108 Second interlayer insulating layer
109 Second contact hole
110 Second contact plug
111 Second line
112 Lower electrode of diode element
112', 112" Conductive layer to become lower electrode of diode element
113, 113' Semiconductor layer
114 Upper electrode of diode element
114' Conductive layer to become upper electrode of diode element

The invention claimed is:

1. A method of manufacturing a semiconductor memory device which includes a variable resistance element comprising:
a lower electrode;
a variable resistance layer formed on the lower electrode and including a first variable resistance layer comprising a transition metal oxide and a second variable resistance layer comprising a transition metal oxide having an oxygen content percentage higher than an oxygen content percentage of the transition metal oxide in the first variable resistance layer; and
an upper electrode formed on the variable resistance layer,
said method comprising:
forming a first lower conductive layer on a semiconductor substrate;
forming a first interlayer insulating layer on the semiconductor substrate so as to cover the first conductive layer;
forming a first contact hole penetrating through the first interlayer insulating layer down to the first conductive layer;
forming a first contact plug inside the first contact hole so that a recess is formed from a top surface of the first interlayer insulating layer toward the substrate;
depositing a lower electrode material film on the first interlayer insulating layer so as to cover the first contact plug, a shape of a depression created in a top surface of the lower electrode material film reflecting a shape of the recess when the lower electrode material film is deposited;
planarizing the deposited lower electrode material film to form the lower electrode with a flat and continuous top surface, wherein the planarizing includes polishing the top surface of the lower electrode material film until the depression in the top surface of the lower electrode material film is removed, and wherein only the lower electrode material film is polished in the polishing, and only the lower electrode material film is left behind on the top surface of the first interlayer insulating layer throughout a wafer of the semiconductor memory device;
forming, on the lower electrode, variable resistance layer material films and an upper electrode material film, in this order, the variable resistance layer material films to become the variable resistance layer, and the upper electrode material film to become the upper electrode; and
forming the variable resistance element by patterning the lower electrode, the variable resistance layer, and the upper electrode.

2. The method of manufacturing a semiconductor memory device according to claim 1,
wherein the lower electrode comprises a plurality of layers including a first lower electrode and a second lower electrode, and
said planarizing of the lower electrode material film to form the lower electrode which has the planarized top surface includes:
depositing a first lower electrode material film on the first interlayer insulating layer so as to cover the first contact plug, the first lower electrode material film to become the first lower electrode;
planarizing, by polishing, a top surface of the deposited first lower electrode material film; and
depositing, on the planarized top surface of the first lower electrode material film, a second lower electrode material film which has a uniform thickness and is to become the second lower electrode.

3. The method of manufacturing a semiconductor memory device according to claim 2,
wherein said planarizing, by polishing, of the top surface of the first lower electrode material film is performed by chemical mechanical polishing.

4. The method of manufacturing a semiconductor memory device according to claim 1,
wherein the lower electrode comprises a plurality of layers including a first lower electrode and a second lower electrode, and
said planarizing of the lower electrode material film to form the lower electrode which has the planarized top surface includes:
depositing a first lower electrode material film on the first interlayer insulating layer so as to cover the first contact plug, the first lower electrode material film to become the first lower electrode;
depositing a second lower electrode material film on the first lower electrode material film, the second lower electrode material film to become the second lower electrode; and
planarizing, by polishing, a top surface of the second lower electrode material film.

5. The method of manufacturing a semiconductor memory device according to claim 4,
wherein said planarizing, by polishing, of the top surface of the second lower electrode material film is performed by chemical mechanical polishing.

6. The method of manufacturing a semiconductor memory device according to claim 1,
   wherein the lower electrode, the variable resistance layer, and the upper electrode are patterned by dry-etching in said forming of the variable resistance element.

7. The method of manufacturing a semiconductor memory device according to claim 1,
   wherein the variable resistance layer is brought into a state to be ready to start resistance change, by locally short-circuiting part of the second variable resistance layer.

8. The method of manufacturing a semiconductor memory device according to claim 1,
   wherein the second variable resistance layer has a thickness which is less than a crosswise width of the recess.

9. The method of manufacturing a semiconductor memory device according to claim 1,
   wherein said planarizing, by polishing, of the top surface of the lower electrode material film is performed by chemical mechanical polishing.

\* \* \* \* \*